United States Patent
Kim et al.

(10) Patent No.: US 11,568,217 B2
(45) Date of Patent: *Jan. 31, 2023

(54) SPARSE MODIFIABLE BIT LENGTH DETERMINISTIC PULSE GENERATION FOR UPDATING ANALOG CROSSBAR ARRAYS

(71) Applicant: International Business Machines Corporation, Armonk, NY (US)

(72) Inventors: Seyoung Kim, Gyeongbuk (KR); Oguzhan Murat Onen, Boston, MA (US); Tayfun Gokmen, Briarcliff Manor, NY (US); Malte Johannes Rasch, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 267 days.

This patent is subject to a terminal disclaimer.

(21) Appl. No.: 16/929,172

(22) Filed: Jul. 15, 2020

(65) Prior Publication Data

US 2022/0019877 A1 Jan. 20, 2022

(51) Int. Cl.
*G06N 3/04* (2006.01)
*G06F 9/30* (2018.01)
(Continued)

(52) U.S. Cl.
CPC ........... *G06N 3/049* (2013.01); *G06F 9/3001* (2013.01); *G06F 9/30036* (2013.01);
(Continued)

(58) Field of Classification Search
CPC ... G06F 9/3001; G06F 9/30036; G06N 3/049; G06N 3/0635; G06N 3/082
See application file for complete search history.

(56) References Cited

U.S. PATENT DOCUMENTS 9,367,798 B2 6/2016 Coenen et al.
9,715,655 B2 7/2017 Wu et al.
(Continued)

FOREIGN PATENT DOCUMENTS

WO 2017155544 A1 9/2017
WO 2018228295 A1 12/2018
WO 2019212488 A1 11/2019

OTHER PUBLICATIONS

Yeo, Injune, Myonglae Chu, and Byung-Geun Lee. "A power and area efficient CMOS stochastic neuron for neural networks employing resistive crossbar array." IEEE Transactions on Biomedical Circuits and Systems 13.6 (2019): 1678-1689. (Year: 2019).*

(Continued)

*Primary Examiner* — Benjamin P Geib
(74) *Attorney, Agent, or Firm* — Cantor Colburn LLP; Erik Johnson

(57) ABSTRACT

Provided are embodiments for a computer-implemented method, a system, and a computer program product for updating analog crossbar arrays. The embodiments include receiving a number used in matrix multiplication to represent using pulse generation for a crossbar array, and receiving a first bit-length to represent the number, wherein the bit-length is a modifiable bit length. The embodiments also include selecting pulse positions in a pulse sequence having the first bit length to represent the number, performing a computation using the selected pulse positions in the pulse sequence, and updating the crossbar array using the computation.

20 Claims, 13 Drawing Sheets

(51) Int. Cl.
*G06K 9/62* (2022.01)
*G06N 3/063* (2006.01)
*G06N 3/08* (2006.01)

(52) U.S. Cl.
CPC ......... *G06K 9/6256* (2013.01); *G06N 3/0635* (2013.01); *G06N 3/082* (2013.01)

(56) References Cited

U.S. PATENT DOCUMENTS

| | | | |
|---|---|---|---|
| 9,904,889 | B2 | 2/2018 | Eliasmith et al. |
| 9,934,463 | B2 | 4/2018 | Seo et al. |
| 10,332,004 | B2 | 6/2019 | Kataeva et al. |
| 10,373,051 | B2 | 8/2019 | Gokmen et al. |
| 10,476,487 | B2 | 11/2019 | Roy et al. |
| 2016/0049195 | A1 | 2/2016 | Yu et al. |
| 2016/0267378 | A1 | 9/2016 | Eleftheriou et al. |
| 2016/0342904 | A1 | 11/2016 | Merkel et al. |
| 2017/0011290 | A1 | 1/2017 | Taha et al. |
| 2017/0109626 | A1 | 4/2017 | Gokmen et al. |
| 2018/0060726 | A1 | 3/2018 | Gokmen et al. |
| 2018/0075338 | A1 | 3/2018 | Gokmen |
| 2018/0300627 | A1* | 10/2018 | Gokmen ............... G06N 3/08 |
| 2018/0373981 | A1 | 12/2018 | Hu et al. |
| 2019/0057301 | A1 | 2/2019 | Pantazi et al. |
| 2019/0122105 | A1 | 4/2019 | Boybat Kara et al. |
| 2019/0197391 | A1 | 6/2019 | Chen et al. |
| 2019/0228287 | A1 | 7/2019 | Okazaki et al. |

OTHER PUBLICATIONS

Liu, Chenchen, et al. "A spiking neuromorphic design with resistive crossbar." 2015 52nd ACM/EDAC/IEEE Design Automation Conference (DAC). IEEE, 2015. (Year: 2015).*

International Search Report and Written Opinion for Application No. PCT/EP2021/067846 dated Oct. 15, 2021, 11 pages.

International Search Report and Written Opinion for Application No. PCT/EP2021/067834 dated Oct. 6, 2021, 11 pages.

Hasan, R., et al., "On-chip training of memristor crossbar based multi-layer neural networks," 2017, Microelectronics Journal, vol. 33, pp. 31-40, 10 pages.

Yeo, I. et al., "A CMOS-based Resistive Crossbar Array with Pulsed Neural Network for Deep Learning Accelerator," 2019 IEEE International Conference on Artificial Intelligence Circuits and Systems (AICAS), pp. 34-37.

List of IBM Patents or Patent Afflictions Treated as Related; (Appendix P), Filed Jul. 15, 2020, 2 pages.

U.S. Appl. No. 16/929,168, filed Jul. 15, 2020, Entitled: "Pulse Generation for Updating Crossbar Arrays"; First Named Inventor: Seyoung Kim.

Wang et al., "Stochastic Sparse Learning with Momentum Adaptation for Imprecise Memristor Networks", https://arxiv.org/pdf/1906.02393.pdf, Jun. 6, 2019, 8 pages.

* cited by examiner

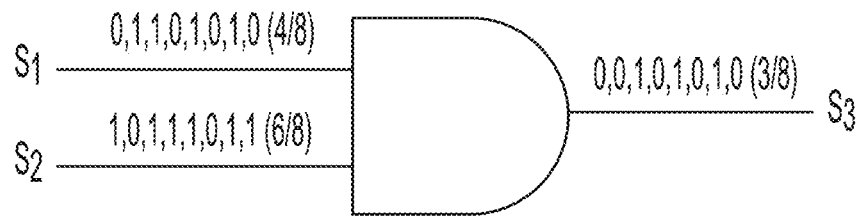
FIG. 5
$$i = g(s,v)v \qquad \text{EQUATION [1]}$$
$$\frac{\partial s(t)}{\partial t} = f(s,v) \qquad \text{EQUATION [2]}$$
FIG. 6
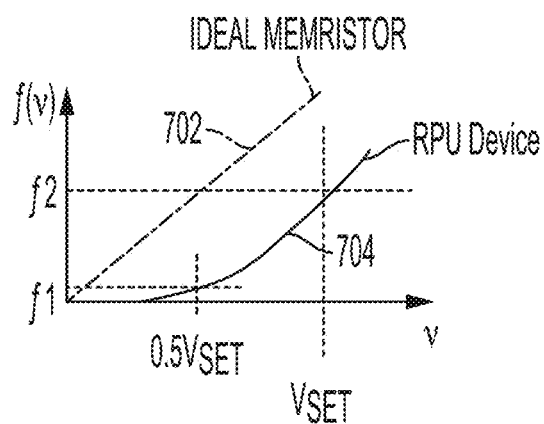
FIG. 7

Sparse XOR Flag Compression

*vector* = 1: *b*
*map* = *round*(*vector* ⊗ *vector* − ε)
*shifted_map* = [*map*(2: end, : ) ; zeros (1, *b*)];

δ = *map* ⊕ *shifted_map* for *t* = 1: *b*
  *x*(1: *t*, *t*) = 1
end

FIG. 12

SPARSE MODIFIABLE BIT LENGTH DETERMINISTIC PULSE GENERATION FOR UPDATING ANALOG CROSSBAR ARRAYS

BACKGROUND

The present invention generally relates to crossbar arrays that implement neural networks, and more specifically, to training neural networks using sparse modifiable bit length deterministic pulse generation for updating analog crossbar arrays.

Artificial neural networks (ANNs), also known as neuromorphic and synaptronic systems, are computational systems that permit electronic systems to essentially function in a manner analogous to that of biological neural systems such as a human brain. In this detailed description, any reference to an ANN is used in the broadest sense to cover a wide range of computer and electronic systems that model biological neural networks, including but not limited to pulsed neural networks (PNNs). Some implementations of ANNs do not generally utilize the traditional digital model of manipulating zeros and ones. Instead, some implementations of ANNs create connections between processing elements that are roughly functionally equivalent to neurons of a biological brain.

ANNs are often implemented as relatively large, parallel computing systems having many simple processors with many interconnections. Modeling a biological nervous system using ANNs (or PNNs) can contribute to a better understanding of biological functions. Many ANN models attempt to use some "organizational" principles believed to be used in the human brain. Contemporary computer hardware technology (such as VLSI and optical) has made such modeling feasible. ANNs incorporate knowledge from a variety of disciplines, including neurophysiology, cognitive science/psychology, physics (statistical mechanics), control theory, computer science, artificial intelligence, statistics/mathematics, pattern recognition, computer vision, parallel processing and hardware (e.g., digital/analog/VLSI/optical).

A contemporary ANN includes a network of artificial neurons (also known as "nodes"). These nodes are connected to each other, and the strength of their connections to one another is assigned a value. For example, connections can be identified as exhibiting inhibition (maximum inhibition being negative 1.0) or excitation (maximum excitation being plus 1.0). If the magnitude value of the connection is high, this indicates a strong connection. Within each node's design, a transfer function is also built in. There are three types of neurons in a typical ANN, namely input nodes, hidden nodes and output nodes.

Input nodes take in information that can be numerically expressed. The information is presented as activation values, wherein each node is given a number, and a number having a higher magnitude causes a greater activation. This information is then passed throughout the network. Based on the connection strengths (weights), inhibition (or excitation), and transfer functions, the activation value is passed from node to node. Each node sums the activation values it receives. Each node than modifies the value based on its transfer function. The activation flows through the input nodes and the hidden layers until it reaches the output nodes. The output nodes reflect the input in a meaningful way to the outside world.

There are many types of neural networks, but the two broadest categories are feed-forward and feed-back networks. A feed-forward network is a non-recurrent network having inputs, outputs, and hidden layers. The signals can only travel in one direction. Input data is passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feed-back network includes feed-back paths, which means that their signals can travel in both directions using loops. All possible connections between neurons are allowed. Because loops are present in this type of network, under certain operations, it can become a non-linear dynamical system that changes continuously until it reaches a state of equilibrium. Feed-back networks are often used in associative memories and optimization problems, wherein the network looks for the best arrangement of interconnected factors.

In an ANN, a spike generation function can be modeled by a component known generally as a temporal encoder or a spike generator. Thus, the ability to gain greater knowledge of the previously describe biological neural system depends on the development of ANNs that model how neural information is encoded in recurrent networks of spiking temporal encoders. Temporal encoders provide an alternative to both digital and analog encoding of information by integrating received signals asynchronously and producing subsequent sets of asynchronous pulsed signals. Certain configurations of temporal encoder networks allow for extraction of information about sets of signals input to the network from sets of pulses or spikes output from the network.

SUMMARY

Embodiments of the present invention are directed to a computer-implemented method of modifiable bit length pulse generation for updating crossbar arrays. A non-limiting example of the computer-implemented method includes receiving a number used in matrix multiplication to represent using pulse generation for a crossbar array, and receiving a first bit-length to represent the number, wherein the bit-length is a modifiable bit length. The computer-implemented method includes selecting pulse positions in a pulse sequence having the first bit length to represent the number, performing, by the processor, a computation using the selected pulse positions in the pulse sequence, and updating, by the processor, the crossbar array using the computation.

Embodiments of the present invention are directed to a system for modifiable bit length pulse generation for updating crossbar arrays. A non-limiting example of the system includes a crossbar array having one or more memristive devices and a processor. The processor is configured to receive a number used in matrix multiplication to represent using pulse generation for the crossbar array, and receive a bit-length to represent the number, wherein the bit-length is a modifiable bit-length. The processor is also configured to select pulse positions in a pulse sequence having the bit length to represent the number, perform a computation using the selected pulse positions in the pulse sequence; and update the crossbar array using the computation, wherein updating the crossbar array changes weights of the one or more memristive devices.

Embodiments of the invention are directed to a computer program product for modifiable bit length pulse generation for updating crossbar arrays, the computer program product including a computer readable storage medium having program instructions embodied therewith. The program instructions are executable by a processor to cause the processor to perform a method. A non-limiting example of the method includes receiving a number used in matrix multiplication to represent using pulse generation for a crossbar array, and receiving a first bit-length to represent the number, wherein the bit-length is a modifiable bit length. The method includes selecting pulse positions in a pulse sequence having the first bit length to represent the number, performing, by the processor, a computation using the selected pulse positions in the pulse sequence, and updating, by the processor, the crossbar array using the computation.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5 depicts a block diagram for a computing methodology capable of being used in one or more embodiments of the invention;

FIG. 6 depicts known equations that govern the operation of a passive, two-terminal memristor capable of being utilized in connection with embodiments of the invention;

FIG. 7 depicts a graphical comparison between switching characteristic of a known two-terminal memristor and the non-linear switching characteristic of a two-terminal RPU capable of being utilized in connection with embodiments of the invention;

FIG. 12 depicts an algorithm for modifying the bit length and selecting bit positions in a bit stream in accordance with one or more embodiments of the invention;

Figure 1:
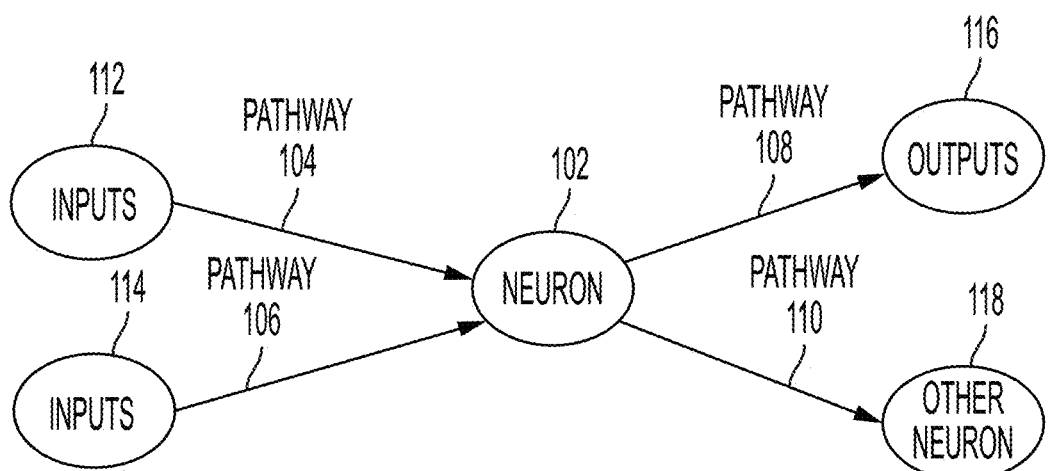
FIG. 1 depicts a diagram of input and output connections of a biological neuron that is modeled using embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment of the invention described herein as "exemplary" is not necessarily to be construed as preferred or advantageous over other embodiments of the invention. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Figure 2:
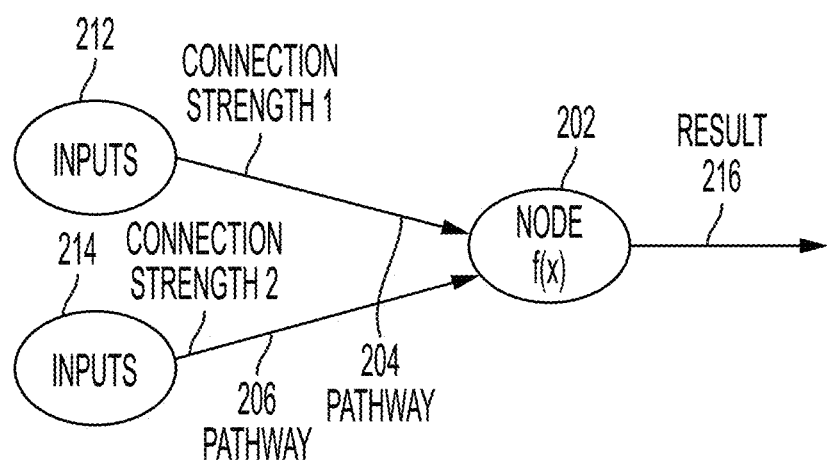
FIG. 2 depicts a model of the biological neuron shown in FIG. 1 capable of being used in connection with embodiments of the invention.
Figure 3:
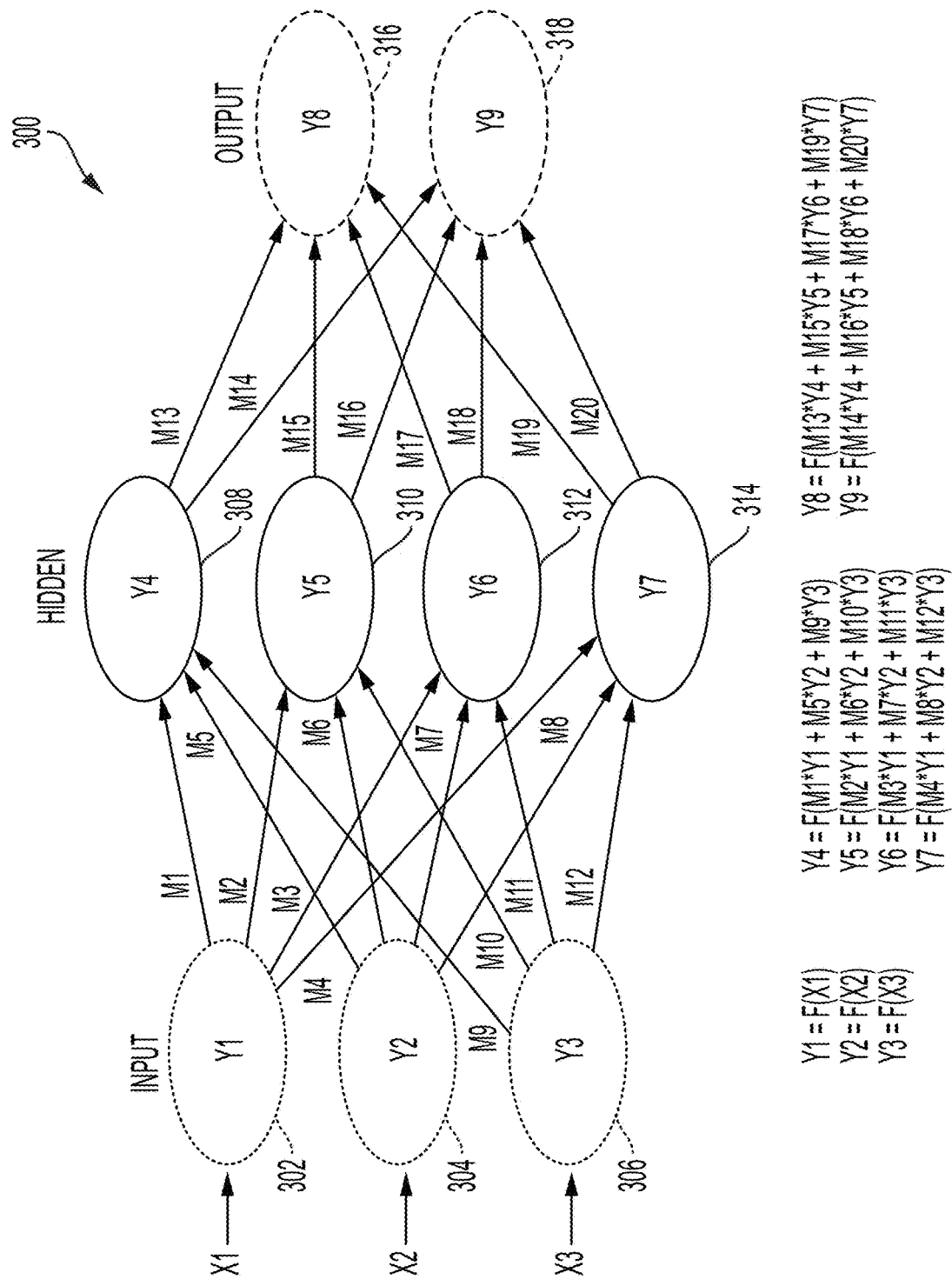
FIG. 3 depicts a model of an ANN incorporating the biological neuron model shown in FIG. 2.

Turning now to an overview of technologies that are more specifically relevant to aspects of the invention, a description of how a typical ANN operates will now be provided with reference to FIGS. 1, 2 and 3. As previously noted herein, a typical ANN models the human brain, which includes about one hundred billion interconnected cells called neurons. FIG. 1 depicts a simplified diagram of a biological neuron 102 having pathways 104, 106, 108, 110 that connect it to upstream inputs 112, 114, downstream outputs 116 and downstream "other" neurons 118, configured and arranged as shown. Each biological neuron 102 sends and receives electrical impulses through pathways 104, 106, 108, 110. The nature of these electrical impulses and how they are processed in biological neuron 102 are primarily responsible for overall brain functionality. The pathway connections between biological neurons can be strong or weak. When a given neuron receives input impulses, the neuron processes the input according to the neuron's function and sends the result of the function to downstream outputs and/or downstream "other" neurons.

Biological neuron 102 is modeled in FIG. 2 as a node 202 having a mathematical function, f(x) depicted by the equation shown in FIG. 2. Node 202 takes electrical signals from inputs 212, 214, multiplies each input 212, 214 by the strength of its respective connection pathway 204, 206, takes a sum of the inputs, passes the sum through a function, f(x), and generates a result 216, which can be a final output or an input to another node, or both. In the present detailed description, an asterisk (*) is used to represent a multiplication. Weak input signals are multiplied by a very small connection strength number, so the impact of a weak input signal on the function is very low. Similarly, strong input signals are multiplied by a higher connection strength number, so the impact of a strong input signal on the function is larger. The function f(x) is a design choice, and a variety of functions can be used. A typical design choice for f(x) is the hyperbolic tangent function, which takes the function of the previous sum and outputs a number between minus one and plus one.

FIG. 3 depicts a simplified ANN model 300 organized as a weighted directional graph, wherein the artificial neurons are nodes (e.g., 302, 308, 316), and wherein weighted directed edges (e.g., m1 to m20) connect the nodes. ANN model 300 is organized such that nodes 302, 304, 306 are input layer nodes, nodes 308, 310, 312, 314 are hidden layer nodes and nodes 316, 318 are output layer nodes. Each node is connected to every node in the adjacent layer by connection pathways, which are depicted in FIG. 3 as directional arrows having connection strengths m1 to m20. Although only one input layer, one hidden layer and one output layer are shown, in practice, multiple input layers, hidden layers and output layers can be provided.

Similar to the functionality of a human brain, each input layer node 302, 304, 306 of ANN 300 receives inputs x1, x2, x3 directly from a source (not shown) with no connection strength adjustments and no node summations. Accordingly, y1=f(x1), y2=f(x2) and y3=f(x3), as shown by the equations listed at the bottom of FIG. 3. Each hidden layer node 308, 310, 312, 314 receives its inputs from all input layer nodes 302, 304, 306 according to the connection strengths associated with the relevant connection pathways. Thus, in hidden layer node 308, y4=f(m1*y1+m5*y2+m9*y3), wherein * represents a multiplication. A similar connection strength multiplication and node summation is performed for hidden layer nodes 310, 312, 314 and output layer nodes 316, 318, as shown by the equations defining functions y5 to y9 depicted at the bottom of FIG. 3.

ANN model 300 processes data records one at a time, and it "learns" by comparing an initially arbitrary classification of the record with the known actual classification of the record. Using a training methodology knows as "backpropagation" (i.e., "backward propagation of errors"), the errors from the initial classification of the first record are fed back into the network and used to modify the network's weighted connections the second time around, and this feedback process continues for many iterations. In the training phase of an ANN, the correct classification for each record is known, and the output nodes can therefore be assigned "correct" values. For example, a node value of "1" (or 0.9) for the node corresponding to the correct class, and a node value of "0" (or 0.1) for the others. It is thus possible to compare the network's calculated values for the output nodes to these "correct" values, and to calculate an error term for each node (i.e., the "delta" rule). These error terms are then used to adjust the weights in the hidden layers so that in the next iteration the output values will be closer to the "correct" values.

Figure 4:
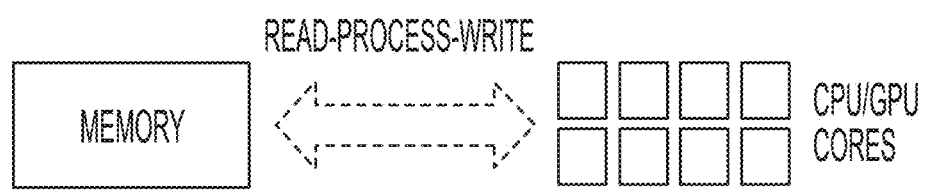
FIG. 4 depicts a block diagram of a known weight update methodology capable of be used in connection with embodiments of the invention.

Notwithstanding the potential for lower power consumption, executing offline training can be difficult and resource intensive because it is typically necessary during training to modify a significant number of adjustable parameters (e.g., weights) in the ANN model to match the input-output pairs for the training data. FIG. 4 depicts a simplified illustration of a typical read-process-write weight update operation, wherein CPU/GPU cores (i.e., simulated "neurons") read a memory (i.e., a simulated "synapse") and perform weight update processing operations, then write the updated weights back to memory. Accordingly, simplifying the crosspoint devices of ANN architectures to prioritize power-saving, offline learning techniques typically mean that training speed and training efficiency are not optimized.

Stochastic computing is a collection of techniques that represent continuous values by streams of random bits, wherein complex computations can be computed by simple bit-wise operations on the streams. Specifically, if there are two random and independent bit streams S1, S2 called stochastic numbers (i.e., a Bernoulli process), wherein the probability of a "one" in the first stream is p, and the probability of a "one" in the second stream is q, the logical AND of the two streams can be taken as shown in FIG. 5. The probability of a "one" in the output stream is pq. By observing enough output bits and measuring the frequency of "ones," it is possible to estimate pq to arbitrary accuracy. Because of the design of the "multiply and accumulate" operations, which can be implemented with a few logic gates/transistors, stochastic computing is often used in the hardware design for neural networks.

However, in some stochastic techniques, the necessary weights for the computations are supplied to the systolic array from external locations, and updates to the weights are not performed by the array. This only addresses the acceleration of vector-matrix multiplication or matrix-matrix multiplication operations that are heavily used during neural network training. However, systolic arrays without local storage cannot perform the weight updates in parallel because the weights are stored at an external memory location. Accelerating the weight updates is necessary in order to accelerate the overall learning algorithm as provided by the embodiments of the techniques described herein.

In addition, training the ANN requires many computations to be performed. As the number of nodes increases the complexity and number of computations increase which can lead to further inefficiencies in training speed and accuracy. In order to compute the outer product used for adjusting the weights, it is inefficient to send $b^2$ pulses to form the outer product, where b represents the number of bits.

Turning now to an overview of the aspects of the invention, one or more embodiments of the invention address the above-described shortcomings of the prior art by providing an efficient neural network training scheme. The techniques of the embodiments of the invention described herein enable the selection of the optimal bit length for training the neural network. In addition, the bit length can be modified during the neural network training phase. The techniques of the embodiments of the invention described herein also select the pulse positions in the pulse sequence based at least in part on the modified bit length to ensure accurate results are obtained while minimizing the error. Error in the outer-product-based update can be introduced by the reduction in the number of pulses and/or the placement of the pulses in the pulse sequence. Therefore, the selected position of pulses in the pulse sequence is highly critical and must be strategically selected to maintain the contours presented in the true multiplication map for the values as the bit length is modified.

The technical effects and benefits of the embodiments of the invention described herein provide an accurate compact representation of the coincidence-detection and update performed in conventional neural network updates. The technical effects and benefits also provide an efficient way to encode the multiplication using only b bits of the pulse sequence with minimal error. To optimize the multiplication, an algorithm in accordance with aspects of the invention provides the smallest representation that is sufficient to compute the outer product for updating the one or more memristors of the crossbar array. In addition, the algorithm is configured to encode values for the update using less than b bits. Providing an algorithm to generate the pulse positions for the values used in the matrix multiplication can accelerate the speed and efficiency of training ANN architectures, as well as improve the overall ANN performance and allow a broader range of ANN applications.

The term "memristor" is used to describe a passive two-terminal electrical component, wherein the resistance value of the device depends on the history of the voltages that have previously been applied to the device. The operation of a memristor is governed by Equations [1] and [2] shown in FIG. 6, wherein i is the current passing through the device, v is the voltage applied to the device, g is the conductance value of the device (which is the inverse of the resistance), s is the internal state variable of the device that controls the conductance value and f is the function that shows the time evolution of the internal state variable s.

The memristor behavior of a crossbar array according to embodiments of the invention is depicted in FIG. 7. To illustrate the difference between an ideal memristor and a non-ideal, non-linear memristor that can be used to implement the described RPU, FIG. 7 is a graph illustrating a comparison between the voltage switching behaviors of an ideal memristor and an RPU in accordance with embodiments of the present invention. The vertical axis of the graph represents device state change at a particular voltage, and the horizontal axis of the graph represents the voltage applied. In an ideal memristor operation, a change in resistance is linearly proportional to the voltage applied to the device. Thus, as soon as the memristor sees any voltage, its resistance state changed. This is shown by curve 702, which shows that the change in state is dramatic even at low voltages.

For non-linear RPU devices as shown by the curve 704, there is a well-defined set voltage, VSET, that the device needs to experience in order to change its internal resistance state. A bias voltage of 0.5 VSET will not change the internal resistance state. In embodiments of the present invention, this non-linear characteristic of the RPU device is exploited to perform multiplication locally. Assuming f1 is small, the device will not change its internal state when only 0.5 VSET is applied. Notably, FIG. 7 illustrates positive voltages and positive changes to the resistive state of the RPU device, however, a similar relationship between negative voltages and negative resistance changes also exists.

Figure 8:
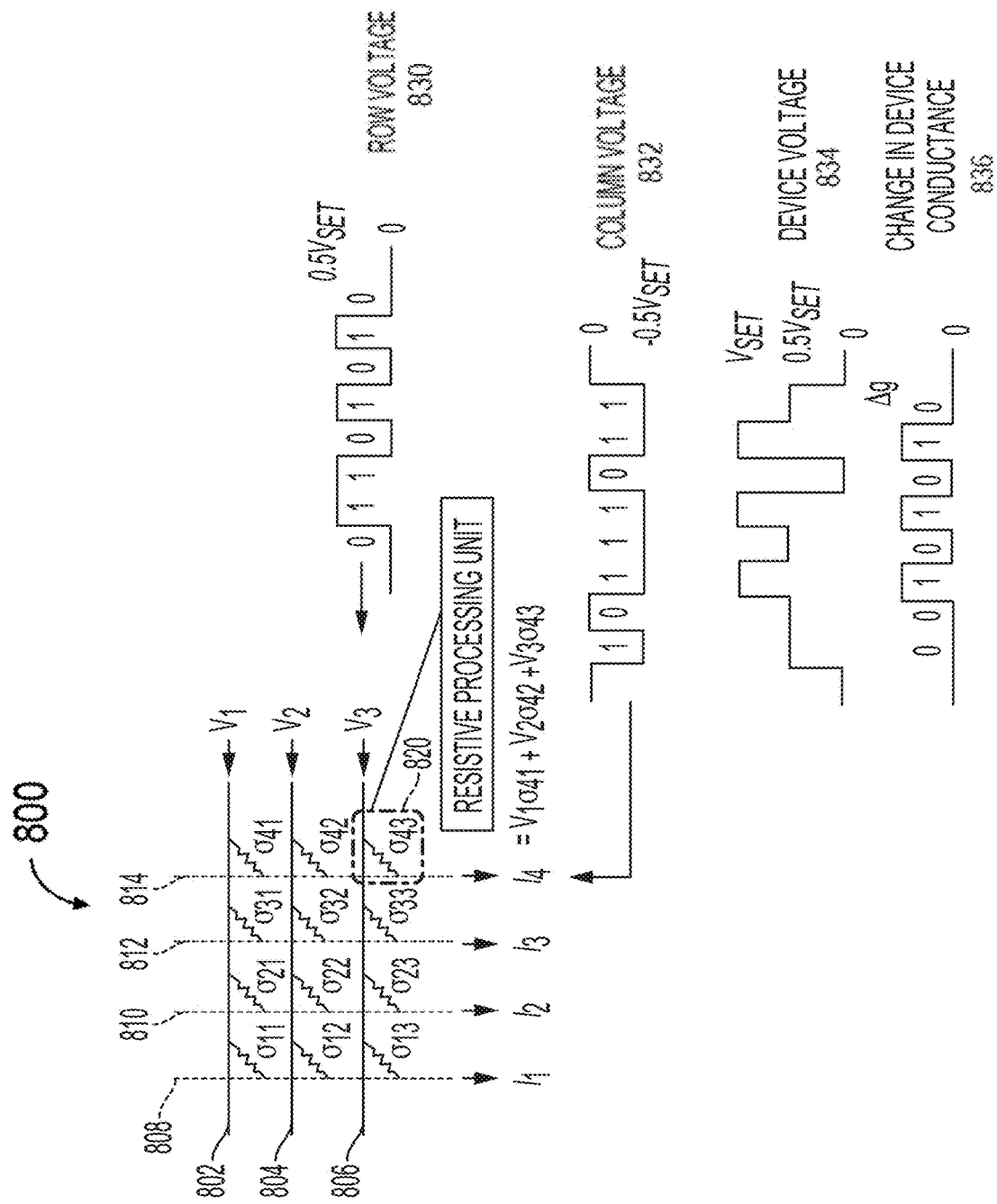
FIG. 8 depicts a crossbar array of two-terminal, non-linear RPU devices according to embodiments of the invention, along with voltage sequences illustrating the operation of the RPU.

Turning now to a more detailed description of aspects of the present invention, FIG. 8 is a diagram of a two-dimensional (2D) crossbar array 800 that performs forward matrix multiplication, backward matrix multiplication and weight updates according to embodiments of the present invention. Crossbar array 800 is formed from a set of conductive row wires 802, 804, 806 and a set of conductive column wires 808, 810, 812, 814 that intersect the set of conductive row wires 802, 804, 806. The intersections between the set of row wires and the set of column wires are separated by RPUs, which are shown in FIG. 8 as resistive elements each having its own adjustable/updateable resistive weight, depicted as σ11, σ21, σ31, σ41, σ12, σ22, σ32, σ42, σ13, σ23, σ33 and σ43, respectively. For ease of illustration, only one RPU 820 is labeled with a reference number in FIG. 8. In forward matrix multiplication, the conduction state (i.e., the stored weights) of the RPU can be read by applying a voltage across the RPU and measuring the current that passes through the RPU.

Input voltages V1, V2, V3 are applied to row wires 802, 804, 806, respectively. Each column wire 808, 810, 812, 814 sums the currents I1, I2, I3, I4 generated by each RPU along the particular column wire. For example, as shown in FIG. 8, the current I4 generated by column wire 814 is according to the equation I4=V1σ41+V2σ42+V3σ43. Thus, array 800 computes the forward matrix multiplication by multiplying the values stored in the RPUs by the row wire inputs, which are defined by voltages V1, V2, V3. The backward matrix multiplication is very similar. In backward matrix multiplication, voltages are applied at column wires 808, 810, 812, 814 then read from row wires 802, 804, 806. For weight updates, which are described in greater detail below, voltages are applied to column wires and row wires at the same time, and the conductance values 836 stored in the relevant RPU devices all update in parallel. Accordingly, the multiplication and addition operations required to perform weight updates are performed locally at each RPU 820 of array 800 using the RPU device itself plus the relevant row or column wire of array 800. Thus, in accordance with embodiments of the present invention, no read-update-write cycles (shown in FIG. 4) are required in array 800.

Continuing with the diagram of FIG. 8, in accordance with one or more embodiments of the invention, the operation of a positive weight update methodology for RPU 820 and its corresponding weight σ33 at the intersection of conductive row wire 806 and conductive column wire 812 will now be provided. The non-linear characteristics of RPU 820 are used to perform multiplication operations locally at RPU 820 using computing as described below. More specifically, the described methodology uses the non-linear switching characteristics of RPU 820 and bit streams 830, 832 to perform multiplication operations and the necessary weight updates locally at RPU 820 without the necessity of other circuit elements. Update generator circuitry (not shown) is provided at the periphery of crossbar array 800 and used as a peripheral "translator" in order to generate necessary voltage pulses in the form of bit streams (e.g., 830, 832) that would be applied to all RPUs of 2D crossbar array 800 in parallel.

Referring briefly to the diagram of FIG. 7, it is assumed that $f_1$ for RPU 820 shown in FIG. 8 is very small (e.g., $f_1=0$) which means that RPU 820 does not change its internal state when only 0.5 VSET is applied to it. A row voltage sequence or bit stream 830, which is applied to row wire 806, is shown as a sequence of voltage pulses representing weight updates having a voltage of zero or a voltage of +0.5 VSET. A column voltage sequence or bit stream 832, which is applied to column wire 814, is shown as a sequence of voltage pulses also representing weight updates having either a voltage of zero or a voltage of −0.5 VSET. In example of FIG. 8, 4/8 is encoded by row voltage sequence 830, and 6/8 is encoded by column voltage sequence 832. The example voltage sequences 830, 832 represent a positive resistance change phase of the weight update. After the positive weight updates are performed, a separate set of sequences with the polarity of the respective voltages reversed can be used to update weights in a negative direction for those weights that need such correction.

Voltage sequence 834 is the voltages applied to RPU 820 resulting from the difference between row voltage sequence 830 and column voltage sequence 832. Voltage sequence 834 will have 3 voltage steps at 0V, 0.5 VSET and VSET. However, because the resistance σ43 of RPU 820 only changes for device voltages reaching VSET, a single pulse either send through a column wire or a row wire is not enough to change the resistance state of RPU 820. When a column wire sends a voltage at 0.5 VSET, and a row wire sends a voltage at −0.5 VSET, the resulting VSET pulse applied to the relevant RPU will cause an incremental change in the resistance of the device. Accordingly, the voltage pulses applied to RPU 820 utilize the non-linear switching characteristic of RPU 820 in order to perform a bit wise AND operation (e.g., as shown in FIG. 5) locally at RPU 820. Hence, the resulting change in the stored weight (e.g., σ43) of the RPU is proportional to the product of the two numbers (4/8*6/8=3/8) "translated" by update generator circuitry, which is peripheral to crossbar array 800.

Figure 9:
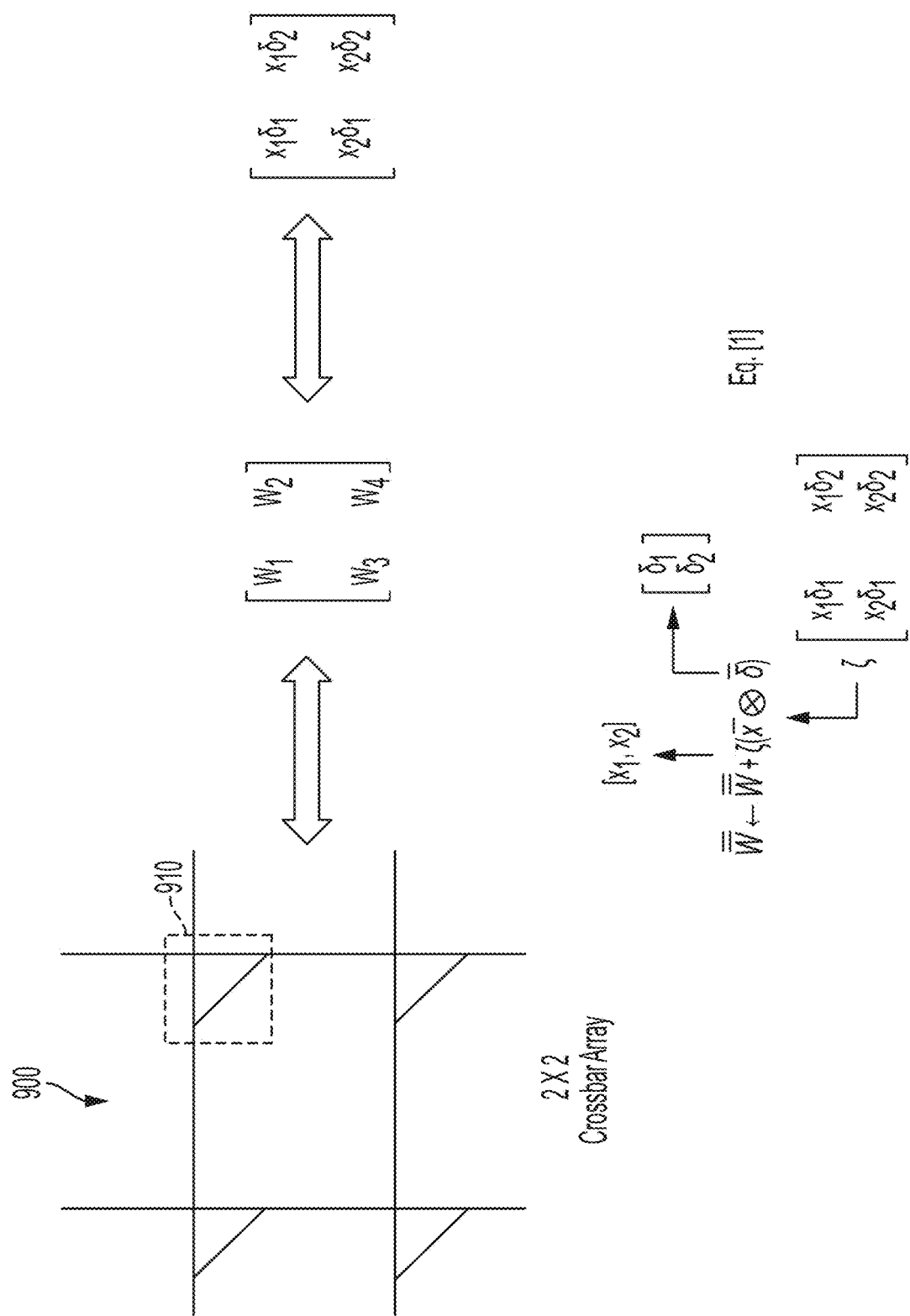
FIG. 9 depicts an example 2×2 crossbar array and weight matrix in accordance with one or more embodiments of the invention.

Now referring to FIG. 9, a two-dimensional representation of a crossbar array 900 and a corresponding weight matrix w for updating the neural network in accordance with one or more embodiments of the invention is shown. The crossbar array 900 includes four processing components 910 arranged as shown in FIG. 9. The weight matrix w includes the elements $w_1, w_2, w_3, w_4$. During neural network training each of the weights corresponding to the processing components can be updated. FIG. 9 also depicts an Equation 1 for updating the weight matrix w. As shown in Equation 1, an outer product operation of x and δ is performed to incrementally update the weights of the weight matrix.

Figure 10:
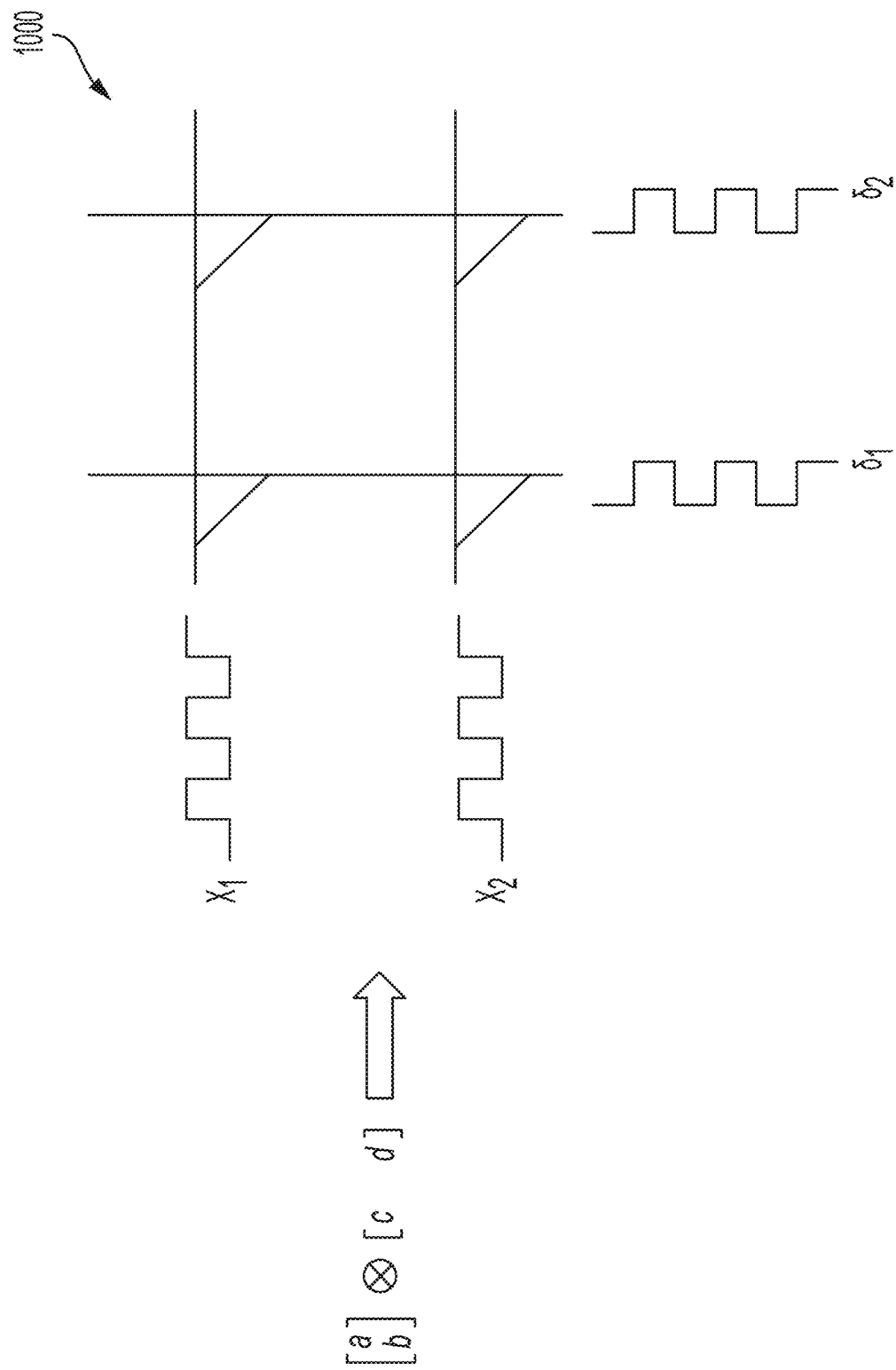
FIG. 10 depicts multiplication with pulse coincidence to update the weights of a neural network in accordance with one or more embodiments of the invention.

FIG. 10 depicts the multiplication with pulse coincidence for updating the crossbar array 1000 in accordance with one or more embodiments of the invention. The pulse sequences for the x and δ values that are determined by the algorithm 1200 (discussed below) are input into the crossbar array 1000 to approximate the multiplication operation for performing the element-wise multiplication of conventional networks. The algorithm 1200 defines an accurate translation between the multiplication operation and the selected pulse positions in the pulse sequences for the x and δ values.

Figure 11:
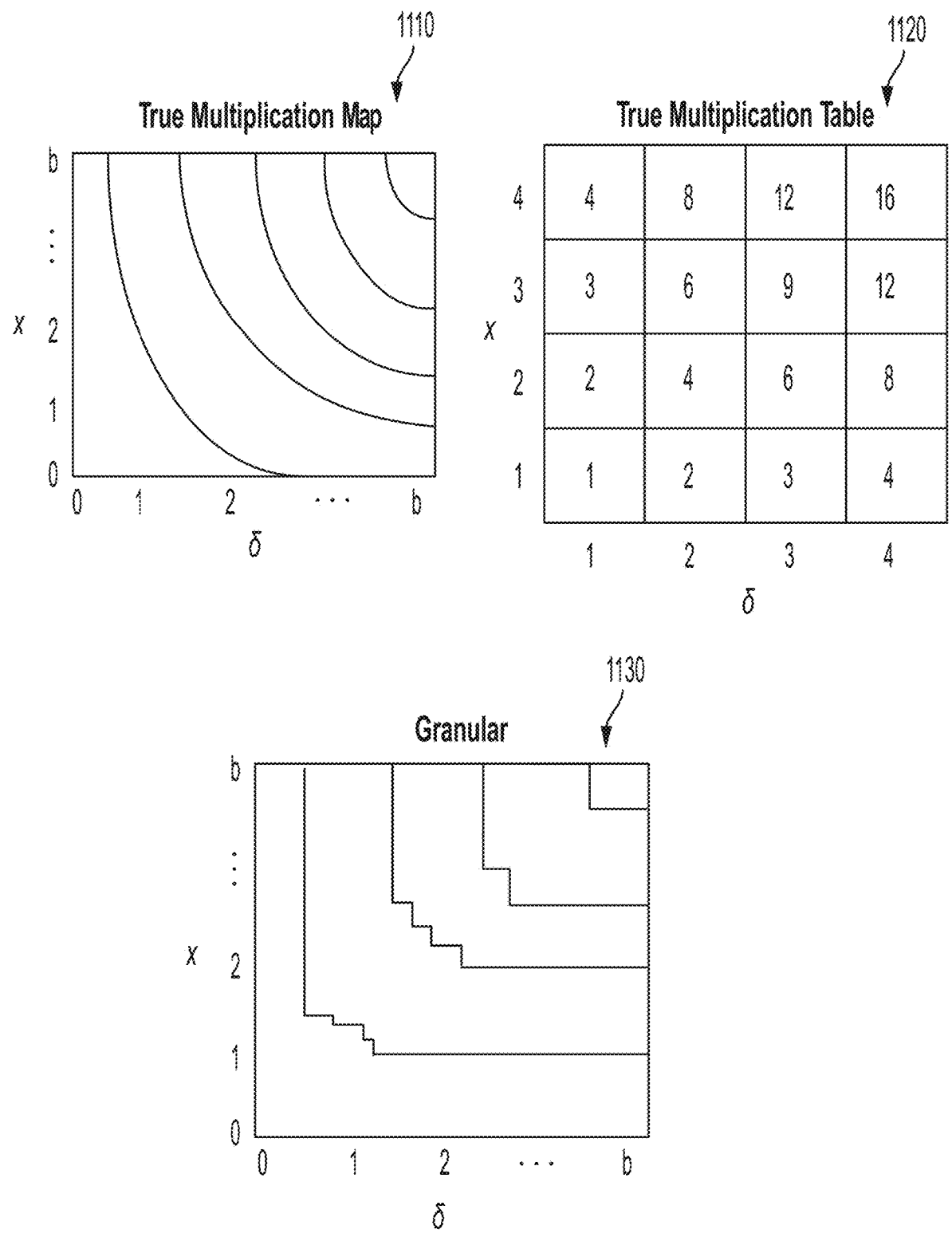
FIG. 11 depicts multiplication maps and a multiplication table in accordance with one or more embodiments of the invention.

FIG. 11 depicts a true multiplication map (also referred to as an update map) and a granular map resulting from approximating the true multiplication map. It should be understood the multiplication map discussed herein refers to the outer-product based updates. Generally, multiplication is often referred to in relation to the forward/backward pass (i.e. vector matrix multiplication), however in the embodiments of the invention described herein, multiplication refers specifically to the outer-product based update. The true multiplication map 1110 and the true multiplication table have been generated for a 2×2 crossbar array having a resolution b of 2. However, it should be understood that the true multiplication map and table can be generated for any crossbar arrays having a different resolution b. As shown in map 1130, an approximation has been performed for the values of x and δ which provide granular results. The granular results can result from the incorrect placement of the pulses in the pulse sequence representing the values for x and δ. The granular approximation is not proper for neural network training and will lead to the degradation of classification performance.

FIG. 12 depicts an algorithm 1200 configured and arranged in accordance with aspects of the invention to provide a methodology to determine the pulse positions of in a pulse sequence for the x and δ values that will provide a compact representation of the true multiplication table. In addition, the algorithm 1200 will generate the least amount of error and maintain the contours of a true multiplication operation required to perform efficient weight updates for the neural network. In addition, the algorithm 1200 includes a methodology that provides the flexible bit length BL, the resolution b for x, δ that can be updated during the neural network training. For example, if b=2, then x, δ [0,1]. However, if b=4, the x, δ[0, 0.25, 0.5, 1]. It is to be understood that the values of b are only an illustration and is not intended to limit b.

In accordance with aspects of the invention, the algorithm 1200 is a sparse XOR flag compression algorithm for selecting a modifiable bit length for training a neural network in accordance with one or more embodiments of the invention. The compression utilizes the placement of the multiplication boundaries. For compression >b (having a BL smaller than b, where the compression=$b^2$/BL) the number of is in the x, δ representation using b slots in total. This enables the bit length to be decided at each step without modifying the neural network circuitry. In addition, the algorithm 1200 ensures the placement of the pulses in the pulse stream for the x and δ values approximate the contours of the true multiplication map.

Figure 13:
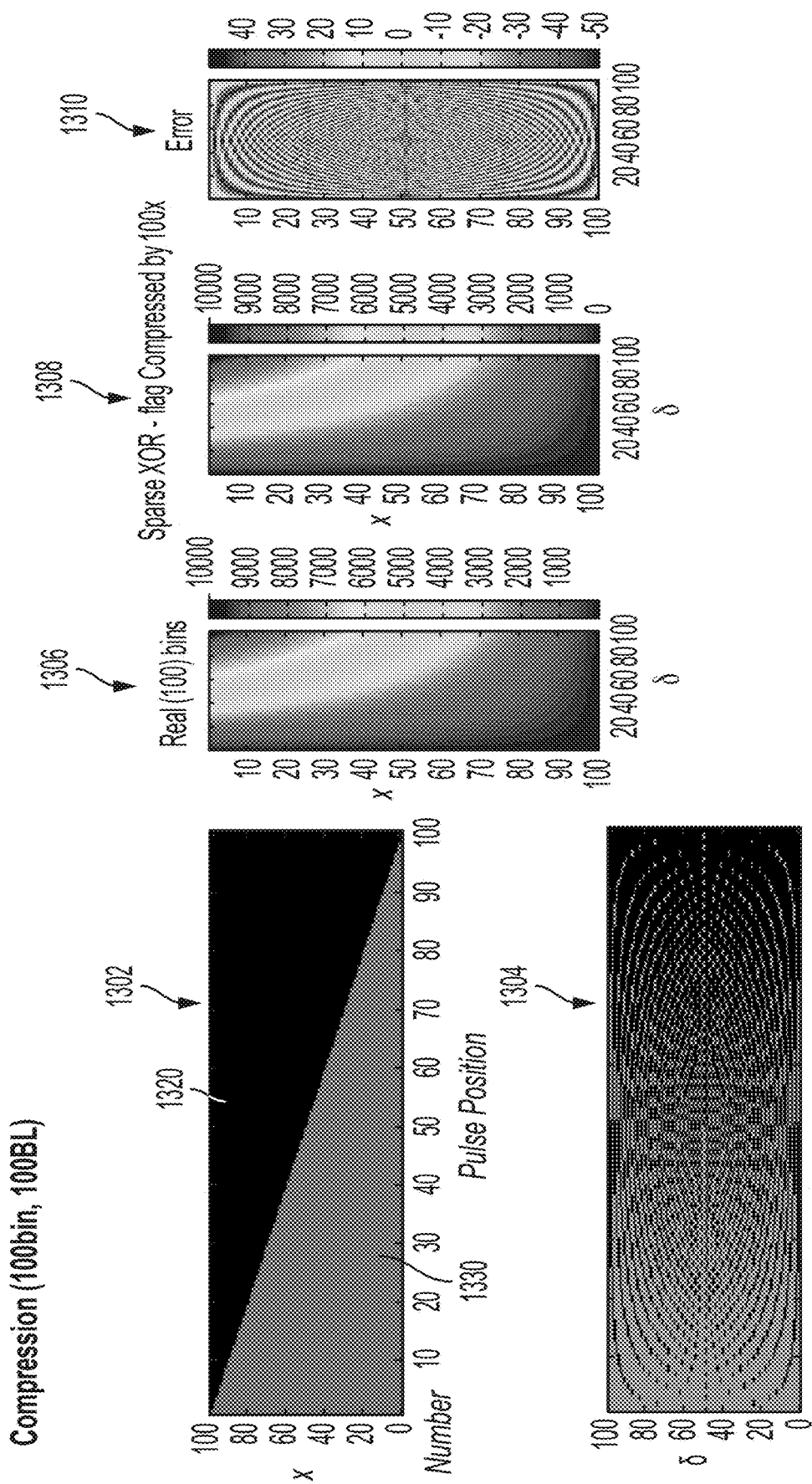
FIG. 13 depicts graphs and multiplication maps in accordance with one or more embodiments of the invention.

FIG. 13 depicts a series of graphs and maps for an example implementation for the sparse modifiable bit deterministic pulse generation to update a crossbar array in accordance with one or more embodiments of the invention. In this non-limiting example, there are b bins (resolution of x, δ) where b bins indicate the x and δ values for a weight matrix w can each take on 100 different values. The resolution b is 100 and the selected bit length (BL) is 100 bits. Conventionally, in order to represent the different numbers for x and δ, $b^2$ number of bits are required to perform an update of the weights used in the neural network because an element-wise multiplication update is performed for each element (x and δ). Using the methodology described in FIG. 12, the compression reduces the $b^2$ number of bits while maintaining similar results as the element-wise multiplication. The methodology of FIG. 12 allows for the resolution b to be selected or modified during the training of the neural network.

In FIG. 13, the graph 1302 represents the x values in the weight matrix used in performing the updates for the neural network. The x-axis of the graph 1302 represents the pulse position in the pulse sequence or the bit position in the bit stream. The y-axis of the graph 1302 represents the numbers for the x values that will be represented by the pulse sequence. The pulse sequence or bit stream can be represented with a series of 1's and zeroes. The regions 1320 represent 1's (logic high) and the regions 1330 represent zeros (logic low). For example, in graph 1302, the row corresponding to the x value of 80 indicates the positions in the pulse sequence the number 80 is represented with the pulses provided in the positions shown on the x-axis. In another example, the bottom row of graph 1302 corresponding to the number 0 is represented with 100 zero-pulses in the pulse sequence and the top row corresponding to 1 is represented by 100 1's in the pulse sequence.

The pulse sequence generated for the x-values and δ delta values are quite different. Therefore, the pulse sequence for the δ values are determined differently than the pulse sequence for the x values and is determined using the algorithm 1200 discussed with reference to FIG. 12. In FIG. 13, the graph 1304 represents the pulse positions in the pulse sequence for the δ values. Similar to graph 1302, the x-axis of the graph 1304 represents the pulse position and the y-axis represents the number for the δ value that is to be used in computation for the update of the weights.

Still referring to FIG. 13, the multiplication map 1306 represents a true multiplication map, such as that shown in FIG. 11, where an element-wise multiplication is performed for each and every element ($x_i$, $\delta_j$) in the weight matrix w. The true multiplication map 1306 provides contours that correspond to the element-wise multiplication. In this example, 10,000 pulses/bits are used to represent each number for performing the matrix multiplication for updating the weights of an analog crossbar array, where the x value is 100 bits and the δ value is 100 bits. As the number of bits increases, the complexity and number of computations quickly increases.

Also shown in FIG. 13 is a heat map 1308 that is generated by taking an outer product for a number for the x-value represented by a first pulse sequence and a number for the δ value represented by a second pulse sequence, where the second pulse sequence for the δ value was determined from the algorithm shown in FIG. 12. The heat map 1308 allows for an intuitive analysis of the approximation of the outer product of the first pulse sequence and the second pulse sequence to the element-wise multiplication of each and every element of the weight matrix w.

As shown in the heat map 1308, the outer product enables a compact representation of the element-wise multiplication to be represented with only 100 bits instead of 10,000 bits when the true multiplication is performed for each and every element. By comparing the multiplication map 1306 to the heat map 1308, an error can be computed by taking the difference between the corresponding values. As shown in FIG. 13, an error map 1310 is computed and can be displayed. The contours of the heat map 1308 are similar to the contours shown in the multiplication map 1306 and the similarity indicates the representation will provide an efficient update and accurate classification for the neural network using the outer product.

Figure 14:
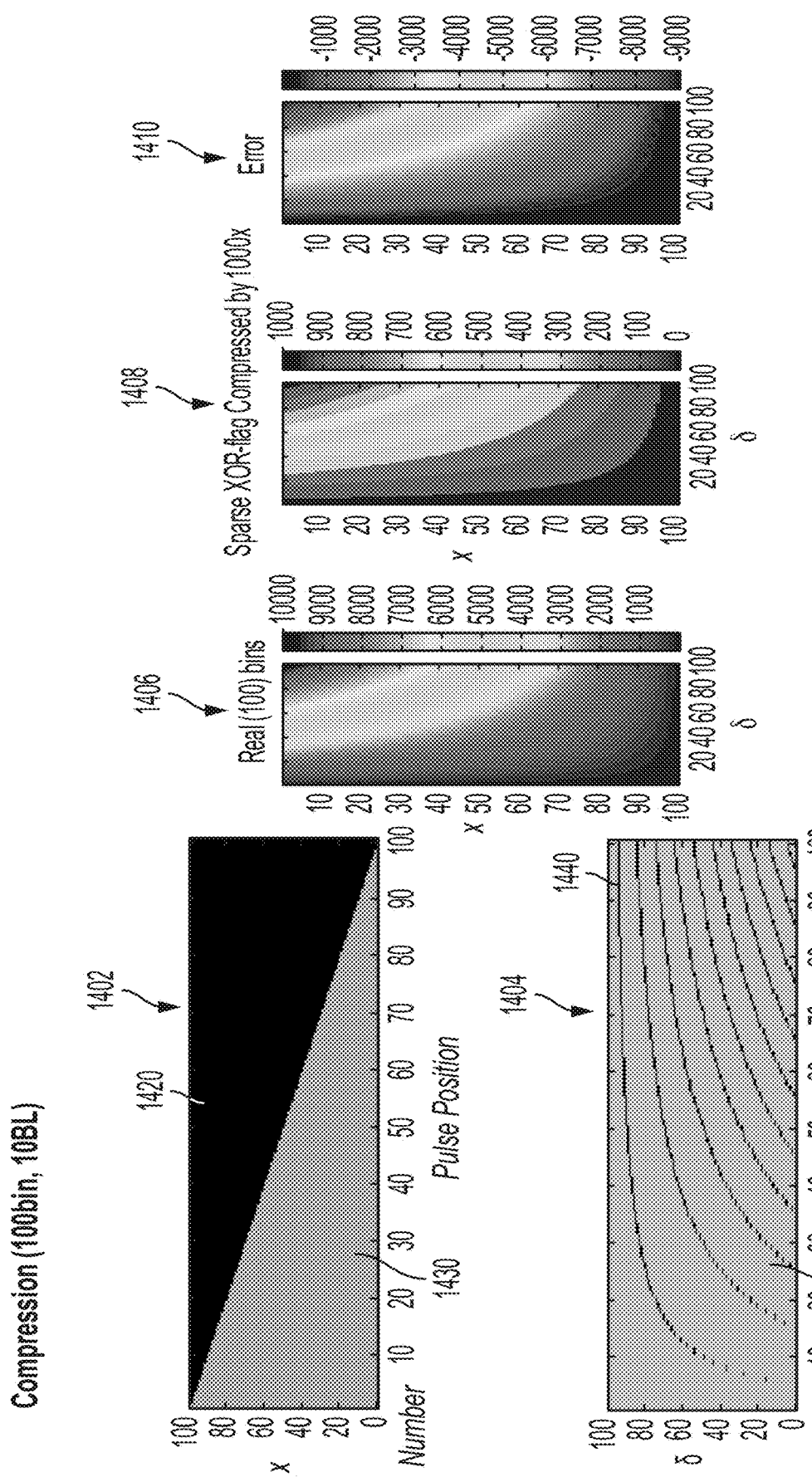
FIG. 14 depicts graphs and multiplication maps in accordance with one or more embodiments of the invention.

In FIG. 14, various graphs and maps illustrating the sparse modifiable compression in accordance with one or more embodiments of the invention is shown. In this particular configuration, the resolution b is 100 and the bit length is 10. Similar to FIG. 13, the graph 1402 represents the pulse sequence for each x value and the graph 1404 represents the pulse sequence for each δ value the will be used in updating the neural network. The regions 1420, 1440 represent 1's (logic high) and the regions 1430, 1450 represent zeros (logic low).

In this example, the bit length has been reduced. In one or more embodiments of the invention, the BL is modified according to the algorithm 1200 of FIG. 12 during the training phase. If a BL is selected in accordance with the algorithm 1200 proper weight updates will be performed in the neural network. Because more values of x and δ of the true multiplication map with a shorter BL, some granularity can be introduced into the heat map. In this example, only 10 options are provided, the contours of the heat map are similar which indicates the error is minimal. Although the bit length has been reduced from 100 to 10, it should be understood this is a non-limiting example and any other value can be used in accordance with one or more embodiments of the invention.

Figure 15:
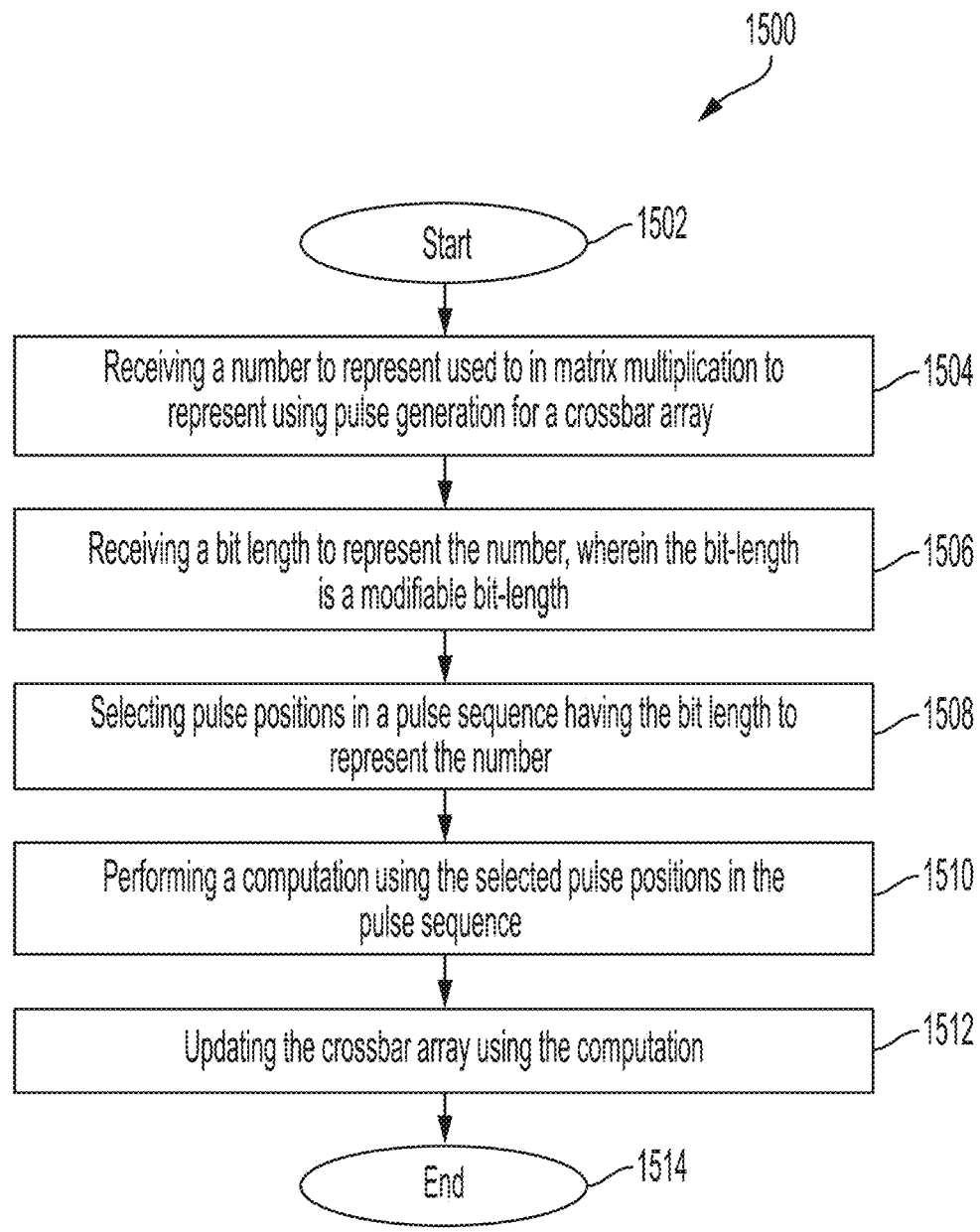
FIG. 15 depicts a flowchart of a method for generating pulses for updating crossbar arrays in accordance with one or more embodiments of the invention.

FIG. 15 depicts a flowchart of a method 1500 for pulse generation for updating a crossbar array in accordance with one or more embodiment of the invention. The method 1500 can be carried out using the processor such as that shown in FIG. 4 or the processor discussed with reference to FIG. 16. It should be understood that any other computing device can be used. The method 1500 begins at block 1502 and proceeds to block 1504 which provides for receiving, by a processor, a number used for matrix multiplication to represent using pulse generation for a crossbar array. Block 1506 receives a bit-length to represent the number, wherein the bit-length is a modifiable bit-length. In one or more embodiment of the invention, the bit-length is updated during the training phase of the neural network. In a subsequent computation the bit-length can be increased or decreased. The bit length that is provided to the processor is known from the neural network. In other embodiments of the invention the bit-length can be input or modified by a user at any phase of the training phase of the neural network. Block 1508 selects pulse positions in a pulse sequence having the bit length to represent the number. In one or more embodiments of the invention, the pulse positions are determined using the algorithm provided in FIG. 9. The pulse positions in a pulse sequence is determined for the δ value. Block 1510 performs a computation using the selected pulse positions in the pulse sequence. An outer product is determined for the first pulse sequence for the δ value and a second pulse sequence for an x value of a weight matrix. The result is used to either add or subtract the increment to adjust the weights for training the neural network. Block 1512 updates the crossbar array using the computation. In one or more embodiments of the invention, the result is used to adjust the conductance of one or more memristive devices in the crossbar array. The method 1500 ends at block 1514. It should be understood that a different sequence of steps or additional steps can be included in the method 1500 and is not intended to be limited by the steps shown in FIG. 15.

Figure 16:
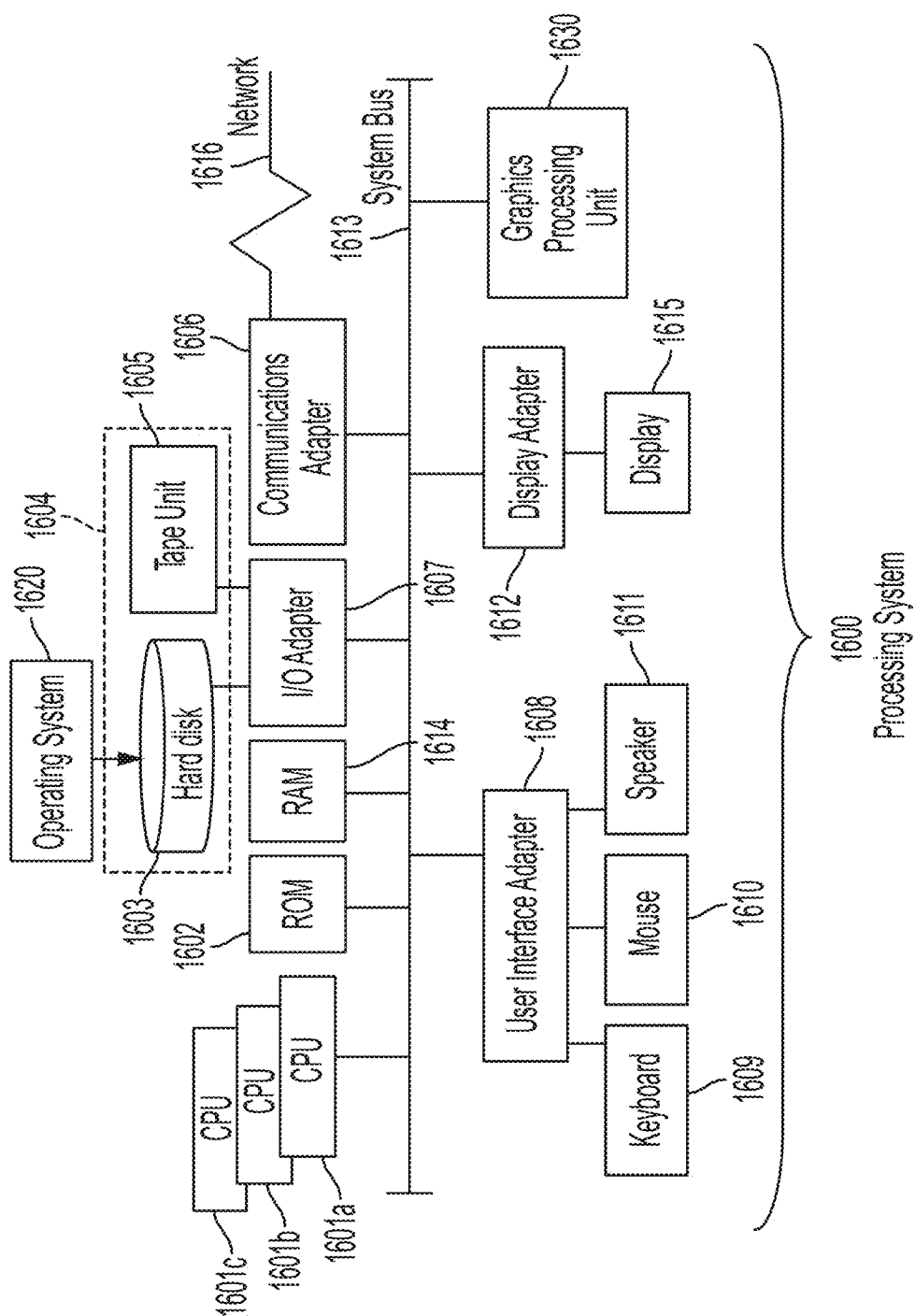
FIG. 16 depicts a block diagram illustrating one example of a processing system for practice of the teachings herein.

Referring to FIG. 16, there is shown a processing system 1600 for implementing aspects of the invention according to the teachings described herein. The processing system can be implemented in the processors (CPU/GPU cores) such as that shown in FIG. 4. In this embodiment of the invention, the system 1600 has one or more central processing units (processors) 1601*a*, 1601*b*, 1601*c*, etc. (collectively or generically referred to as processor(s) 1601). In some embodiments of the invention, each processor 1601 can include a reduced instruction set computer (RISC) microprocessor. Processors 1601 are coupled to system memory 1614 and various other components via a system bus 1613. Read only memory (ROM) 1602 is coupled to the system bus 1613 and can include a basic input/output system (BIOS), which controls certain basic functions of system 1600.

FIG. 16 further depicts an input/output (I/O) adapter 1607 and a network adapter 1606 coupled to the system bus 1613. I/O adapter 1607 can be a small computer system interface (SCSI) adapter that communicates with a hard disk 1603 and/or tape storage drive 1605 or any other similar component. I/O adapter 1607, hard disk 1603, and tape storage device 1605 are collectively referred to herein as mass storage 1604. Operating system 1620 for execution on the processing system 1600 can be stored in mass storage 1604. A network adapter 1606 interconnects bus 1613 with an outside network 1616 enabling data processing system 1600 to communicate with other such systems. A screen (e.g., a display monitor) 1615 is connected to system bus 1613 by display adaptor 1612, which can include a graphics adapter to improve the performance of graphics intensive applications and a video controller. In some embodiments of the invention, adapters 1607, 1606, and 1612 can be connected to one or more I/O busses that are connected to system bus 1613 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 1613 via a user interface adapter 1608 and display adapter 1612. A keyboard 1609, mouse 1610, and speaker 1611 all interconnected to bus 1613 via user interface adapter 1608, which can include, for example, a Super I/O chip integrating multiple device adapters into a single integrated circuit.

In exemplary embodiments of the invention, the processing system 1600 includes a graphics processing unit 1630. Graphics processing unit 1630 is a specialized electronic circuit designed to manipulate and alter memory to accelerate the creation of images in a frame buffer intended for output to a display. In general, graphics processing unit 1630 is very efficient at manipulating computer graphics and image processing, and has a highly parallel structure that makes it more effective than general-purpose CPUs for algorithms where processing of large blocks of data is done in parallel.

Thus, as configured in FIG. 16, the system 1600 includes processing capability in the form of processors 1601, storage capability including system memory 1614 and mass storage 1604, input means such as keyboard 1609 and mouse 1610, and output capability including speaker 1611 and display 1615. In some embodiments of the invention, a portion of system memory 1614 and mass storage 1604 collectively store an operating system to coordinate the functions of the various components shown in FIG. 16.

The embodiments of the invention described herein improve over the prior art by determining the bit positions within a bit stream to represent each of the numbers used for multiplication for the neural network training. The embodiments of the invention described herein also improve over the prior art by enabling the BL to be modified during the training phases of the neural network. The BL can be increased or decreased from the initial BL. In addition, the embodiments of the invention described herein provide for accelerating the training of the neural network using these methodologies by providing the initial values for the neural network prior to receiving any weight updates.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for pulse generation for updating analog crossbar arrays, the computer-implemented method comprising:
   receiving, by a processor, a number used in matrix multiplication to represent using pulse generation for a crossbar array;
   receiving, by the processor, a first bit-length to represent the number, wherein the bit-length is a modifiable bit length;
   selecting, by the processor, pulse positions in a pulse sequence having the first bit length to represent the number;
   performing, by the processor, a computation using the selected pulse positions in the pulse sequence;
   updating, by the processor, the crossbar array using the computation; and
   identifying a pulse coincidence between a first pulse sequence and a second pulse sequence;
   wherein at least one of the first pulse sequence or second pulse sequence comprises the selected pulse positions.

2. The computer-implemented method of claim 1 further comprising:
   selecting a second bit-length, wherein the second bit-length is different than the first bit-length;
   selecting pulse positions for an updated pulse sequence having the second bit-length to represent the number;
   performing a subsequent computation using the selected pulse positions in the updated pulse sequence; and
   updating the crossbar array using the subsequent computation, wherein updating the crossbar array comprises updating a conductance value of one or more memristive devices of the crossbar array based at least in part on the computation and the subsequent computation.

3. The computer-implemented method of claim 1 further comprising modifying the first bit-length to the second bit-length during a training phase of a neural network.

4. The computer-implemented method of claim 1, wherein the computation comprises performing an outer product operation with the number used in the matrix multiplication and a second number used in the matrix multiplication.

5. The computer-implemented method of claim 1 further comprising generating a heat map, wherein the generated heat map is based at least in part on the pulse coincidence between the first pulse sequence and the second pulse sequence, wherein at least one first pulse sequence corresponds to the number and the second pulse sequence corresponds to a second number.

6. The computer-implemented method of claim 5 further comprising comparing a true multiplication map to the generated heat map using the selected pulse positions, wherein the true multiplication map performs an element-wise multiplication for each element.

7. The computer-implemented method of claim 6 further comprising:
   determining an error between the true multiplication map and the generated heat map; and
   displaying the error between the true multiplication map and the generated heat map.

8. A system for implementing pulse generation for updating crossbar arrays, the system comprising:
   a crossbar array comprising one or more memristive devices;
   a processor configured to:
      receive a number used in matrix multiplication to represent using pulse generation for the crossbar array;
      receive a bit-length to represent the number, wherein the bit-length is a modifiable bit-length;
      select pulse positions in a pulse sequence having the bit length to represent the number;
      perform a computation using the selected pulse positions in the pulse sequence;
      update the crossbar array using the computation, wherein updating the crossbar array changes weights of the one or more memristive devices; and
      identify a pulse coincidence between a first pulse sequence and a second pulse sequence;
      wherein at least one of the first pulse sequence or second pulse sequence comprises the selected pulse positions.

9. The system of claim 8, wherein the processor is configured to:
   select a second bit-length, wherein the second bit-length is different than the first bit-length;
   select pulse positions for an updated pulse sequence having the second bit-length to represent the number;
   perform a subsequent computation using the selected pulse positions in the updated pulse sequence; and
   update the crossbar array using the subsequent computation, wherein updating the crossbar array comprises updating a conductance value of the one or more memristive devices of the crossbar array based at least in part on the computation and the subsequent computation.

10. The system of claim 8, wherein the processor is configured to modify the first bit-length to the second bit-length during a training phase of a neural network.

11. The system of claim 8, wherein the computation comprises performing an outer product operation with the number used in the matrix multiplication and a second number used in the matrix multiplication.

12. The system of claim 8, wherein the selected pulse positions in the pulse sequence are based at least in part on the bit length.

13. The system of claim 8, wherein the processor is further configured to generate a heat map, wherein the generated heat map is based at least in part on the pulse coincidence between the first pulse sequence and the second pulse sequence.

14. The system of claim 13 further comprising:
   comparing a true multiplication map to the generated heat map using the selected pulse positions, wherein the true multiplication map performs an element-wise multiplication for each element;
   determining an error between the true multiplication map and the generated heat map; and
   displaying the error between the true multiplication map and the generated heat map.

15. A computer program product for pulse generation for updating analog crossbar arrays, the computer program product comprising:
   a computer readable storage medium having stored thereon first program instructions executable by a processor to cause the processor to:
      receive a number used in matrix multiplication to represent using pulse generation for a crossbar array;
      receive a bit-length to represent the number, wherein the bit-length is a modifiable bit-length;
      select pulse positions in a pulse sequence having the bit length to represent the number;
      perform a computation using the selected pulse positions in the pulse sequence;
      update the crossbar array using the computation, wherein updating the crossbar array comprises updating a conductance value of one or more memristive devices of the crossbar array based at least in part on the computation; and
      identify a pulse coincidence between a first pulse sequence and a second pulse sequence;
      wherein at least one of the first pulse sequence or second pulse sequence comprises the selected pulse positions.

16. The computer program product of claim 15, wherein the instructions are further executable by the processor to cause the processor to:
   select a second bit-length, wherein the second bit-length is different than the first bit-length;
   select pulse positions for an updated pulse sequence having the second bit-length to represent the number;
   perform a subsequent computation using the selected pulse positions in the updated pulse sequence; and
   update the crossbar array using the subsequent computation, wherein updating the crossbar array comprises updating a conductance value of the one or more memristive devices of the crossbar array based at least in part on the computation and the subsequent computation.

17. The computer program product of claim 15, wherein the instructions are further executable by a processor to cause the processor to modify the first bit-length to the second bit-length during a training phase of a neural network.

18. The computer program product of claim 15, wherein the instructions are further executable by a processor to cause the processor to determine the outer product of a first pulse sequence and a second pulse sequence for the neural network.

19. The computer program product of claim 15, wherein the instructions are further executable by a processor to cause the processor to generate a heat map, wherein the generated heat map is based at least in part on the pulse coincidence between the first pulse sequence and the second pulse sequence.

20. The computer program product of claim 19, wherein the instructions are further executable by a processor to cause the processor to:

compare a true multiplication map to the generated heat map using the selected pulse positions, wherein the true multiplication map performs an element-wise multiplication for each element;
determine an error between the true multiplication map and the generated heat map; and
display the error between the true multiplication map and the generated heat map.

\* \* \* \* \*